United States Patent
Liao

[11] Patent Number: 6,077,771
[45] Date of Patent: Jun. 20, 2000

[54] METHOD FOR FORMING A BARRIER LAYER

[75] Inventor: Kuan-Yang Liao, Taipei, Taiwan

[73] Assignee: United Silicon Incorporated, Hsinchu, Taiwan

[21] Appl. No.: 09/082,657

[22] Filed: May 21, 1998

[30] Foreign Application Priority Data

Apr. 20, 1998 [TW] Taiwan ................................. 87105997

[51] Int. Cl.[7] .................................................. H01L 21/28
[52] U.S. Cl. .......................... 438/627; 438/635; 438/638; 438/643; 438/653
[58] Field of Search .................................... 438/653, 627, 438/643, 644, 744, 624, 635, 437, 637, 638

[56] References Cited

U.S. PATENT DOCUMENTS

| | | | |
|---|---|---|---|
| 4,968,644 | 11/1990 | Gallagher et al. | 438/680 |
| 5,674,787 | 10/1997 | Zhao et al. | 438/627 |
| 5,702,976 | 12/1997 | Schuegraf et al. | 438/437 |
| 5,804,505 | 9/1998 | Yamada et al. | 438/643 |
| 5,918,150 | 6/1999 | Nguyen et al. | 438/653 |

*Primary Examiner*—Mary Wilczewski
*Assistant Examiner*—Yung A. Lin
*Attorney, Agent, or Firm*—Christie, Parker & Hale, LLP

[57] ABSTRACT

A procedure for forming the barrier layer includes a plasma procedure in the fabricating procedure. The procedure is that an opening is formed on a dielectric layer, which is formed over a semiconductor substrate, by a damascene technology or a patterning process. Then, the plasma procedure is applied by following a procedure in which a halide gas is flowed over the substrate. Then, the halide gas is dissolved by applying plasma to it to form halogen atoms with free bonds, which can enter the dielectric layer to form another halide with the dielectric material and stay close to the surface. Then, a metal layer is formed over the substrate. The metal layer fills the opening and results in a reaction with the halide in the surface of the dielectric layer. A nonvolatile metallic halide layer, therefore, is formed. The nonvolatile metallic halide layer is a nonvolatile insulating layer that acts as the barrier layer between the metal layer and the dielectric layer.

19 Claims, 3 Drawing Sheets

METHOD FOR FORMING A BARRIER LAYER

CROSS-REFERENCE TO RELATED APPLICATION

This application claims the priority benefit of Taiwan application serial no. 87105997, filed Apr. 20, 1998, the full disclosure of which is incorporated herein by reference.

BACKGROUND OF THE INVENTION

1. Field of the Invention

This invention relates to a method for forming a barrier layer, and more particularly to further utilize a plasma procedure for forming the barrier layer.

2. Description of Related Art

For a structure of metallization in semiconductor, a barrier layer is usually formed between a metal layer and a silicon layer or a dielectric layer in order to avoid a phenomenon in which the metal layer diffuses into the silicon layer or the dielectric layer,. This can also avoid the occurrence of shorts or openings in the metal layer, which result from the phenomena of spiking or electromigration.

FIG. 1A and FIG. 1B are sectional plots schematically illustrating a procedure for fabricating a conventional barrier layer in a metallization structure of semiconductor.

Referring to FIG. 1A, a semiconductor substrate 100 has a metal layer 102 and a barrier layer 104 including TiN sequentially formed under a substrate surface 101. Then, a dielectric layer 106 made from a material such as oxide is formed over the substrate 100. Then, an opening 108a is formed in the dielectric layer 106 by a damascene technology to expose the barrier layer 104. The opening is used for a via window and metal line. Another trench opening 108b is formed by patterning the dielectric layer 106 but without going through it. Next, as shown in FIG. 1B, a barrier layer 110 is formed over the openings 108a, 108b. Then, after filling in the openings 108a, 108b with metal material and applying a planarization process on the substrate 100, a via window 112a, a metal line 112b and a trench plug 112c are formed over the substrate 100.

If the metal material for filling the opening 108a, 108b is copper (Cu), the atoms of copper can diffuse into the dielectric layer 106 at a temperature for a chemical vapor deposition (CVD) process. Therefore, the barrier layer 110 including materials such as TiN or WN is needed in between to avoid the diffusion of copper atoms into the dielectric layer 106.

As described above, even though the barrier layer 110 can stop diffusion, it increases the ohmic contact of the via window 112a, the metal line 112b and the trench plug 112c. Moreover, the conventional structure of the barrier layer also causes some problems when the semiconductor device design is reduced the size. One of problems is that the spaces for the via window 112a, the metal line 112b and the trench plug 112c are getting narrower, which makes it difficult to fill these spaces with metal material.

SUMMARY OF THE INVENTION

It is therefore an objective of the present invention to provide a barrier layer with a structure that enhances filling ability. The barrier layer structure is achieved by forming a thin barrier layer under the surface of the dielectric layer so that the barrier layer need not occupy the space of a via window and a metal line, which are formed on the dielectric layer. In addition, the barrier layer as presented in this invention doesn't increase the resistance of contact.

In accordance with the foregoing and other objectives of the present invention, a procedure for forming the barrier layer includes a plasma procedure in the fabricating procedure. In this procedure, an opening is formed on a dielectric layer, which is formed over a semiconductor substrate, by a damascene technology or a patterning process. Then, the plasma procedure is applied by flowing a halide gas over the substrate. Then, the halide gas is dissolved by applying plasma on it to form halogen atoms with free bonds, which can enter the dielectric layer to form another halide with dielectric material and stay close to the surface. Then, a metal layer is formed over the substrate to fill the opening, which results in a reaction on the surface of the dielectric layer with the halide. A nonvolatile metallic halide layer, therefore, is formed. The nonvolatile metallic halide layer is a nonvolatile insulating layer that acts as the barrier layer between the metal layer and the dielectric layer.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

FIGS. 2A–2D are sectional plots schematically illustrating a procedure for fabricating a barrier layer in a metallization structure of semiconductor, according to a preferred embodiment of the invention.

Figure 1A:
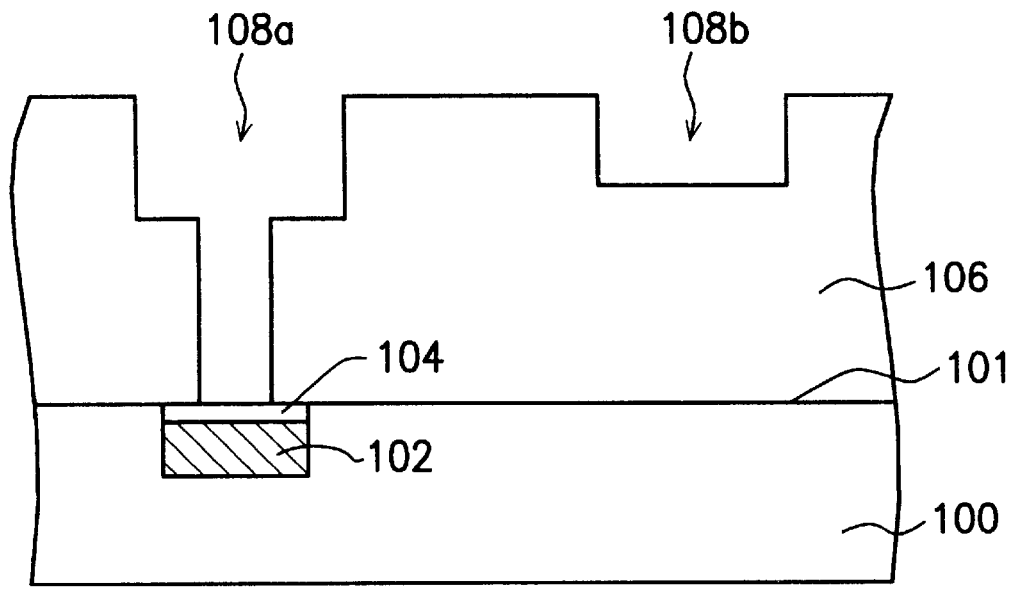
FIG. 1A and FIG. 1B are sectional plots schematically illustrating a procedure for fabricating a conventional barrier layer in a metallization structure of semiconductor.
Figure 1B:
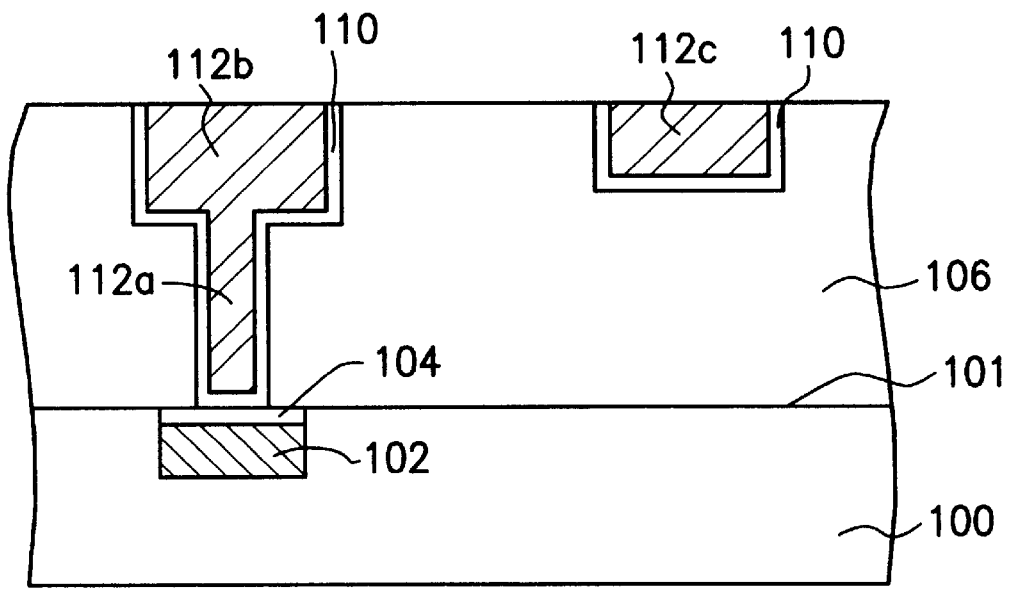
Figure 2A:
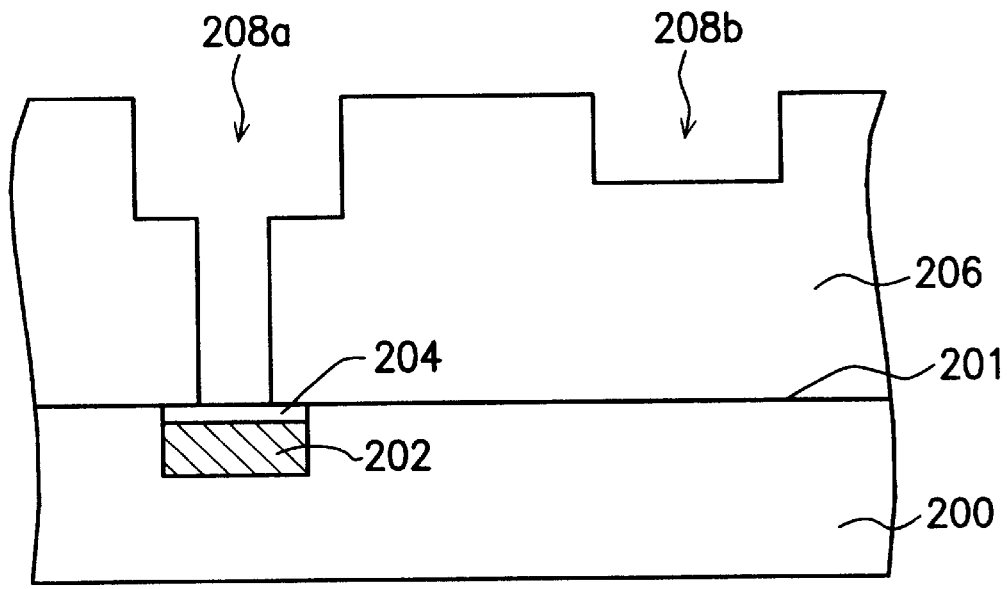
FIGS. 2A–2D are sectional plots schematically illustrating a procedure for fabricating a barrier layer in a metallization structure of a semiconductor, according to a preferred embodiment of the invention.

Referring to FIG. 2A, a metal layer 202 and a barrier layer 204 are formed on a semiconductor substrate 200, which has a structure of device on it(not shown), under the substrate surface 201. Then, a dielectric layer 206, preferably including materials such as $SiO_2$ or materials with low dielectric constants, is formed over the substrate 200. Then, an opening 208a is formed, by damascene technology on the dielectric layer 206 to expose the barrier layer 204 to be used for a via window and a metal line, which are to be seen in FIG. 2D. A trench opening 208b is formed also on the dielectric layer 206 by patterning it.

Figure 2B:
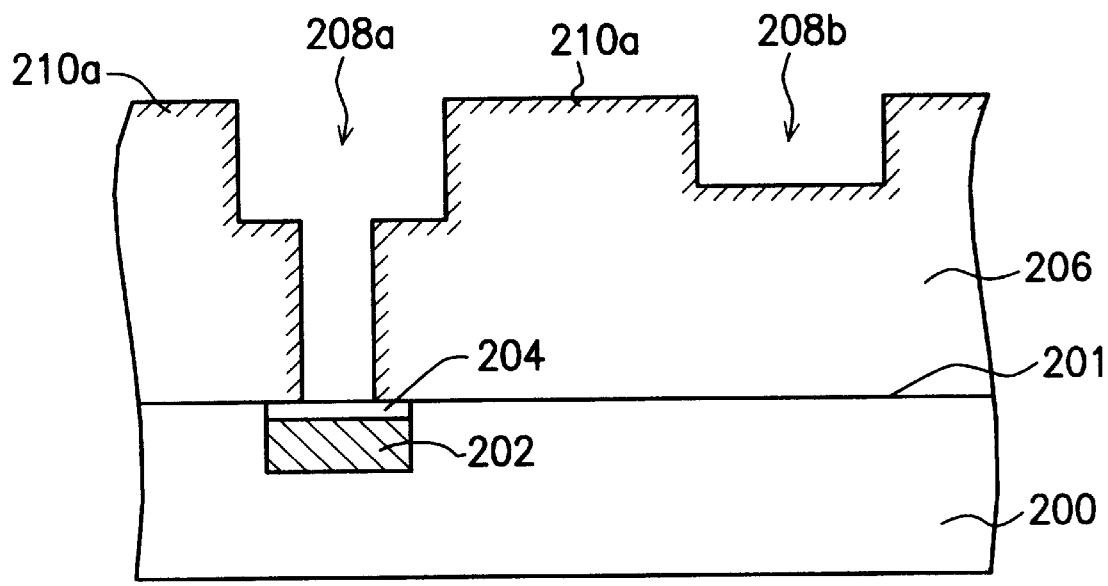

Then, a plasma procedure is applied in the following procedure. Referring to FIG. 2B, a halide such as HBr (not shown) is first flowed over the substrate. Then, the halide gas is dissolved by applying plasma to it to form halogen atoms with free bonds, which can enter the dielectric layer 206 to form a halide layer 210a and stay close to the surface of the dielectric layer 206. If the dielectric layer 206 is made of $SiO_2$, the halide layer 210a can include $SiO_xBr_x$ or $Br_2O_3$. In the plasma procedure, the halide gas may also react with the barrier layer 204 but it should not penetrate through the barrier layer 204 to etch the metal layer 202. Further, the byproduct of reaction can be removed by cleaning and doesn't undermine the quality.

The plasma source described above is produced with a low power, because a high power plasma can unexpectedly etch the substrate and the low power plasma has been enough to dissolve the halide gas in the invention, so that a DC bias technology can be used to produce the plasma source.

Figure 2C:
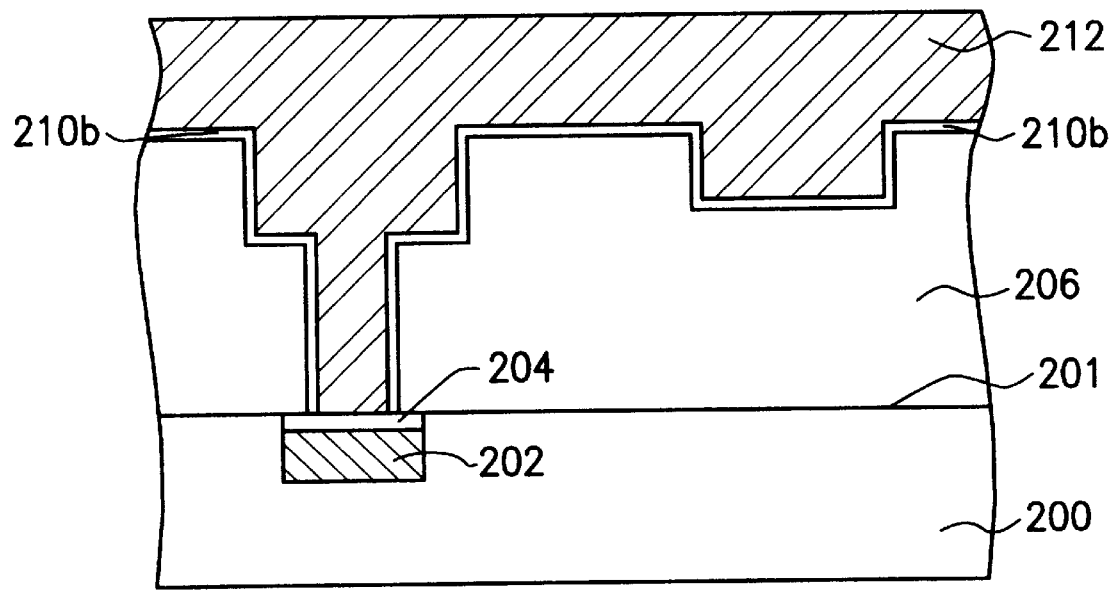

Referring to FIG. 2B and FIG. 2C, a metal layer 212 including materials such as copper (Cu) is formed over the substrate 200 and fills the openings 208a, 208b. The metal layer 212 can react with the halide 21a in the periphery of the dielectric layer 206 to form a metallic halide layer 210b, which is a nonvolatile insulator and can survive in the high temperature environment required by the fabricating procedure. The metallic halide layer 210b acts as a barrier layer 210b between the metal layer 212 and the dielectric layer 206. If the metal layer 212 is made of Cu, then the metallic halide 210b is $CuBr_x$.

The halide gas, with the exception of HBr, can be any compound with one halogen and any metal material such as $SF_6$, HI or HCl. However, if $SF_6$ and HCl are used, erosion on the dielectric layer 206 and the barrier layer 204 are a concern, and HI does not react easily with the metal layer 212. In the plasma procedure, either argon gas or nitrogen gas is flowed in addition to the halide gas to enhance the quality of the barrier layer 210b.

Figure 2D:
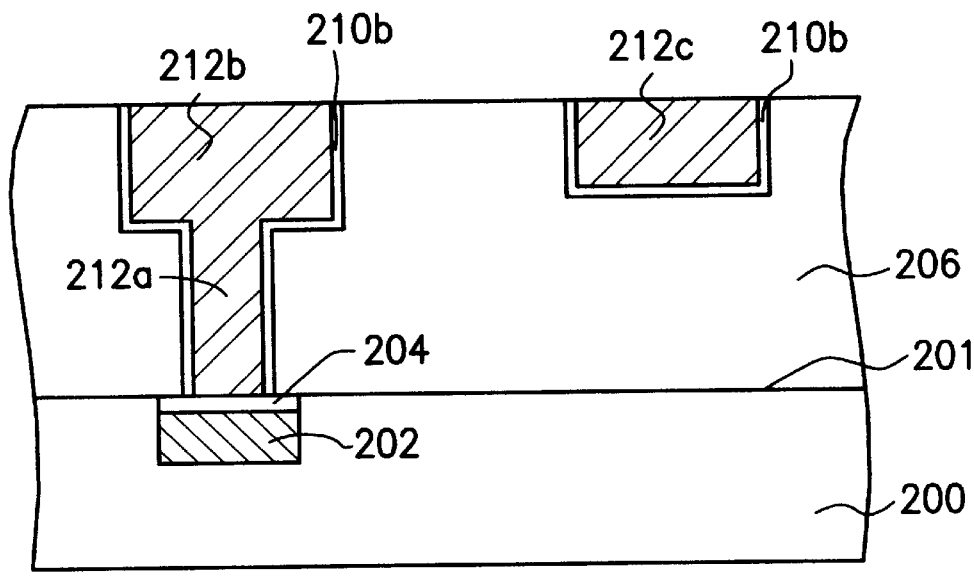

Referring to FIG. 2C and FIG. 2D, by using a chemical mechanical polishing technology for planarization on the metal layer 212 to expose the dielectric layer 216 so that a via window 212a, a metal line 212b and a trench plug 212c are formed. Therefore, a metallization structure of a semiconductor is formed.

The invention has been characterized by providing a nonvolatile insulating layer as the barrier layer 210b to avoid diffusion of metal of the via 212a, metal line 212b and trench plug 212c into the dielectric layer 216. Therefore, the reliability of the structure of metallization is enhanced and the space of the openings is not consumed by the process. Furthermore, because the barrier layer 210b is formed in situ in the surface of the dielectric layer 216, it doesn't occupy the space of the openings 208a, 208b and, therefore, it doesn't affect the ability to fill metal into the openings 208a, 208b. Further, the barrier layer 210b doesn't decrease the ohmic contact.

The invention has been described using exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A procedure for fabricating a barrier layer, suitable for a semiconductor substrate with a device on the substrate, the procedure comprising:
   forming a first metal layer and a first barrier layer on the substrate sequentially;
   forming a dielectric layer on the substrate and patterning the dielectric layer by a damascene technology to form an opening for exposing the first barrier layer; and
   forming a nonvolatile insulating layer containing a metallic halide on the dielectric layer to serve as a second barrier layer.

2. The procedure of claim 1, wherein said step of forming a nonvolatile insulating layer on the dielectric layer comprises a procedure:
   flowing a halide over the dielectric layer and applying a plasma technology to put the halide into a surface of the dielectric layer; and
   forming a second metal layer over the substrate to fill the opening, wherein the second metal layer reacts with the halide to in situ form a metallic halide in the dielectric layer, and wherein the metallic halide is a nonvolatile insulating layer.

3. The procedure of claim 2, wherein the plasma technology comprises a low power plasma.

4. The procedure of claim 1, wherein the dielectric layer comprises a material with a low dielectric constant.

5. The procedure of claim 1, wherein the dielectric layer comprises oxide.

6. The procedure of claim 2, wherein the second metal layer comprises copper (Cu).

7. The procedure of claim 2, wherein the halide comprises HBr.

8. A procedure for fabricating a barrier layer, suitable for a semiconductor substrate with a device on the substrate; the procedure comprising:
   forming a dielectric layer on the substrate and patterning the dielectric layer to form a trench opening; and
   forming a nonvolatile insulating layer on the dielectric layer wherein the nonvolatile insulating layer is formed by first performing plasma to put a halide into the dielectric and reacting the halide with a metal layer formed within the trench opening.

9. The procedure of claim 8, wherein said step of forming a nonvolatile insulating layer on the dielectric layer comprises a procedure:
   flowing a halide over the dielectric layer and applying a plasma technology to put the halide into a surface of the dielectric layer; and
   forming a metal layer over the substrate with the opening being filled, wherein the metal layer reacts with the halide to in situ form a metallic halide on the dielectric layer, and the metallic halide is a nonvolatile insulating layer.

10. The procedure of claim 9, wherein the plasma technology comprises a low power plasma.

11. The procedure of claim 8, wherein the dielectric layer comprises a low dielectric constant material.

12. The procedure of claim 9, wherein the metal layer comprises copper (Cu).

13. The procedure of claim 9, wherein the halide comprises HBr.

14. A procedure for fabricating a barrier layer, suitable for a semiconductor substrate with a device on the substrate, the procedure comprising:
   forming a first metal layer and a first barrier layer on the substrate sequentially;
   forming a dielectric layer on the substrate and patterning the dielectric layer by a damascene technology to form an opening for exposing the first barrier layer;
   flowing a halide over the dielectric layer and applying a plasma technology to put the halide into a surface of the dielectric layer; and
   forming a second metal layer over the substrate with the opening being filled, wherein the second metal layer reacts with the halide to form in situ a metallic halide on the dielectric layer, and the metallic halide serves as a second barrier layer.

15. The procedure of claim 14, wherein in said step of flowing a halide over the dielectric layer and applying a plasma technology to put the halide into a surface of the dielectric layer, the dielectric layer comprising $SiO_2$ and the halide comprising HBr form a $Br_2O_3$ layer on a surface of the dielectric layer.

16. The procedure of claim 14, wherein the second metal layer comprises copper so that the nonvolatile metallic halide comprises $CuBr_x$.

17. A procedure for fabricating a barrier layer, suitable for a semiconductor substrate with a device on the substrate, the procedure comprising:

forming a dielectric layer on the substrate and patterning the dielectric layer to form a trench opening;

flowing a halide over the dielectric layer and applying a plasma technology to put the halide into a surface of the dielectric layer; and forming a metal layer over the substrate with the opening being filled, wherein the metal layer reacts with the halide to form in situ a nonvolatile metallic halide on a surface of the dielectric layer to serve as a barrier layer.

18. The procedure of claim 17, wherein in said step of flowing a halide over the dielectric layer and applying a plasma technology to put the halide into a surface of the dielectric layer, the dielectric layer comprising $SiO_2$ and the halide comprising HBr form a $Br_2O_3$ layer on a surface of the dielectric layer.

19. The procedure of claim 17, wherein the second metal layer comprises copper so that the nonvolatile metallic halide comprises $CuBr_x$.

\* \* \* \* \*